United States Patent
Hsu et al.

(10) Patent No.: US 11,563,088 B2
(45) Date of Patent: Jan. 24, 2023

(54) SEMICONDUCTOR DEVICE WITH STRAIN RELAXED LAYER

(71) Applicant: UNITED MICROELECTRONICS CORP., Hsin-Chu (TW)

(72) Inventors: Yu-Ming Hsu, Changhua County (TW); Yu-Chi Wang, Taipei (TW); Yen-Hsing Chen, Taipei (TW); Tsung-Mu Yang, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 64 days.

(21) Appl. No.: 16/708,448

(22) Filed: Dec. 10, 2019

(65) Prior Publication Data

US 2021/0134957 A1 May 6, 2021

(30) Foreign Application Priority Data

Oct. 30, 2019 (CN) .......................... 201911042514.2

(51) Int. Cl.
*H01L 29/15* (2006.01)
*H01L 29/778* (2006.01)

(52) U.S. Cl.
CPC ........ *H01L 29/151* (2013.01); *H01L 29/7786* (2013.01)

(58) Field of Classification Search
None
See application file for complete search history.

(56) References Cited

U.S. PATENT DOCUMENTS

| | | | |
|---|---|---|---|
| 5,831,277 A | 11/1998 | Razeghi | |
| 7,666,765 B2 | 2/2010 | Cheng | |
| 7,846,820 B2 | 12/2010 | Ishibashi | |
| 8,426,893 B2 | 4/2013 | Ikuta | |
| 2005/0006639 A1 | 1/2005 | Dupuis | |
| 2006/0154455 A1 | 7/2006 | Guo | |
| 2012/0074385 A1 | 3/2012 | Tak | |
| 2012/0153261 A1 | 6/2012 | Kim | |
| 2012/0223365 A1* | 9/2012 | Briere | H01L 29/2003 257/194 |
| 2013/0062621 A1* | 3/2013 | Fichtenbaum | H01L 29/66462 257/190 |
| 2014/0209862 A1* | 7/2014 | Ikuta | H01L 29/7787 257/22 |
| 2016/0211330 A1* | 7/2016 | Li | H01L 29/7786 |
| 2017/0125562 A1* | 5/2017 | Prechtl | H01L 29/2003 |
| 2018/0069085 A1* | 3/2018 | Laboutin | H01L 21/02458 |
| 2019/0109208 A1* | 4/2019 | Wang | H01L 29/7786 |
| 2019/0157081 A1* | 5/2019 | Zhao | H01L 21/02458 |
| 2020/0403090 A1* | 12/2020 | Lin | H01L 29/41766 |

FOREIGN PATENT DOCUMENTS

| | | |
|---|---|---|
| EP | 1905097 | 9/2013 |
| WO | 9641906 | 12/1996 |

* cited by examiner

*Primary Examiner* — Khaja Ahmad
(74) *Attorney, Agent, or Firm* — Winston Hsu

(57) ABSTRACT

A semiconductor device includes an epitaxial substrate. The epitaxial substrate includes a substrate. A strain relaxed layer covers and contacts the substrate. A III-V compound stacked layer covers and contacts the strain relaxed layer. The III-V compound stacked layer is a multilayer epitaxial structure formed by aluminum nitride, aluminum gallium nitride or a combination of aluminum nitride and aluminum gallium nitride.

10 Claims, 5 Drawing Sheets

SEMICONDUCTOR DEVICE WITH STRAIN RELAXED LAYER

BACKGROUND OF THE INVENTION

1. Field of the Invention

The present invention relates to a semiconductor device, and more particularly to a semiconductor device utilizing a strain relaxed layer to prevent stress generated by lattice mismatch.

2. Description of the Prior Art

Due to their semiconductor characteristics, III-V semiconductor compounds may be applied in many kinds of integrated circuit devices, such as high power field effect transistors, high frequency transistors, or high electron mobility transistors. In the high electron mobility transistor, two semiconductor materials with different band-gaps are combined and a heterojunction is formed at the junction between the semiconductor materials as a channel for carriers. In recent years, gallium nitride based materials have been applied in high power and high frequency products because of their properties of wider band-gap and high saturation velocity.

A two-dimensional electron gas (2DEG) may be generated by the piezoelectric property of the GaN-based materials, and the switching velocity may be enhanced because of the higher electron velocity and the higher electron density of the 2DEG.

However, because a lattice size of the III-V semiconductor compound and a lattice size of a substrate are greatly different, unwanted stress is generated in the III-V semiconductor compound. As a result, the efficiency of an HEMT will be decreased by this stress.

SUMMARY OF THE INVENTION

In light of the above, a strain relaxed layer is disposed between a substrate and a III-V compound stacked layer to prevent the stress caused by different lattice sizes which influences the III-V compound stacked layer.

According to a preferred embodiment of the present invention, a semiconductor device includes an epitaxial substrate. The epitaxial substrate includes a substrate, a strain-relaxed layer covering and contacting the substrate and a III-V compound stacked layer covering and contacting the strain-relaxed layer. The III-V compound stacked layer includes aluminum nitride, aluminum gallium nitride or a combination of aluminum nitride and aluminum gallium nitride, and the III-V compound stacked layer is a multilayer epitaxial structure.

According to another preferred embodiment of the present invention, a semiconductor device includes an epitaxial substrate. The epitaxial substrate includes a substrate, a nucleation layer covering and contacting the substrate, a transition layer covering and contacting the nucleation layer, a superlattice covering and contacting the transition layer, and a strain-relaxed layer disposed in the superlattice. The nucleation layer includes aluminum nitride, the transition layer includes aluminum gallium nitride, the superlattice is formed by periodically stacking aluminum gallium nitride and aluminum nitride and the superlattice includes silicon oxide, silicon nitride or silicon carbide.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
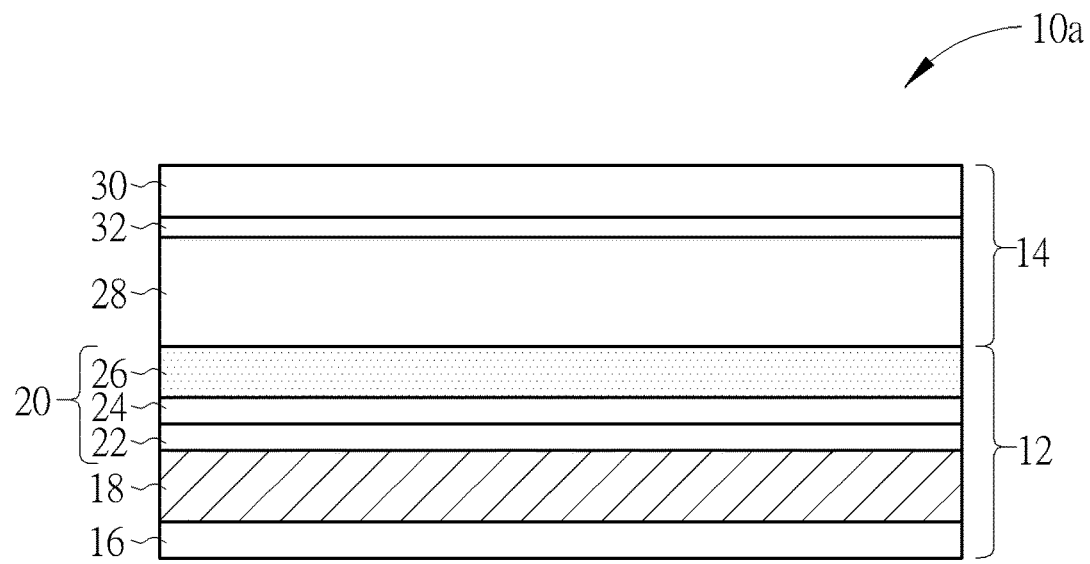
FIG. 1 depicts a semiconductor substrate according to a first preferred embodiment of the present invention.

FIG. 1 depicts a semiconductor substrate according to a first preferred embodiment of the present invention.

As shown in FIG. 1, a semiconductor substrate 10a includes an epitaxial substrate 12 and a device layer 14. The device layer 14 contacts and covers the epitaxial substrate 12. The epitaxial substrate 12 includes a substrate 16, a strain-relaxed layer 18, and a III-V compound stacked layer 20. The substrate 16 includes a silicon substrate, a sapphire substrate or a silicon on insulator (SOI) substrate. The strain-relaxed layer 18 covers and contacts the substrate 16. The strain-relaxed layer 18 includes silicon oxide, silicon nitride, or silicon carbide. The III-V compound stacked layer 20 covers and contacts the strain-relaxed layer 18. The III-V compound stacked layer 20 includes aluminum nitride, aluminum gallium nitride, gallium nitride, a combination of aluminum nitride and aluminum gallium nitride, a combination of aluminum nitride and gallium nitride or a combination of aluminum nitride, aluminum gallium nitride and gallium nitride. Furthermore, the III-V compound stacked layer 20 is a multilayer epitaxial structure. Moreover, the III-V compound stacked layer 20 can include only one type of material including aluminum nitride, aluminum gallium nitride or gallium nitride. On the other hand, the III-V compound stacked layer 20 can be a combination of aluminum nitride, aluminum gallium nitride and gallium nitride. The strain-relaxed layer 18 preferably does not include stress. Moreover, a thickness of the strain-relaxed layer 18 is greater than 1 nanometer.

In details, in the first preferred embodiment, the III-V compound stacked layer 20 includes a nucleation layer 22, a transition layer 24 and a superlattice 26. The nucleation layer 22 covers and contacts the strain-relaxed layer 18. The nucleation layer 22 preferably includes aluminum nitride. The transition layer 24 covers and contacts the nucleation layer 22. The transition layer 24 preferably includes aluminum gallium nitride. The superlattice 26 covers and contacts the transition layer 24. The superlattice 26 is formed by periodically stacking aluminum gallium nitride and aluminum nitride. Moreover, a chemical formula of the aluminum gallium nitride in the transition layer 24 is $Al_xGa_{1-x}N$, and $0.7 \leq X \leq 0.8$. The transition layer 24 can be a single layer or multiple layers. If the transition layer 24 is multiple layers, X can be altered to form numerous aluminum gallium nitride layers which have different ratios of aluminum to gallium. A chemical formula of the aluminum gallium nitride in the superlattice 26 is $Al_yGa_{1-y}N$, and $0.2 \leq Y \leq 0.3$. The superlattice 26 is formed by periodically stacking aluminum gallium nitride and aluminum nitride. Furthermore, Y can be altered to form numerous aluminum gallium nitride layers which have different ratios of aluminum to gallium. For example, the superlattice 26 may be a repeated stacked structure formed by $AlN/Al_{0.2}Ga_{0.8}N$, or a repeated stacked structure formed by $AlN/Al_{0.2}Ga_{0.8}N/Al_{0.3}Ga_{0.7}N$.

The device layer 14 includes a gallium nitride layer 28 and an aluminum gallium nitride layer 30 disposed on the gallium nitride layer 28. An aluminum nitride layer 32 can be optionally disposed between the aluminum gallium nitride layer 30 and the gallium nitride layer 28.

Figure 2:
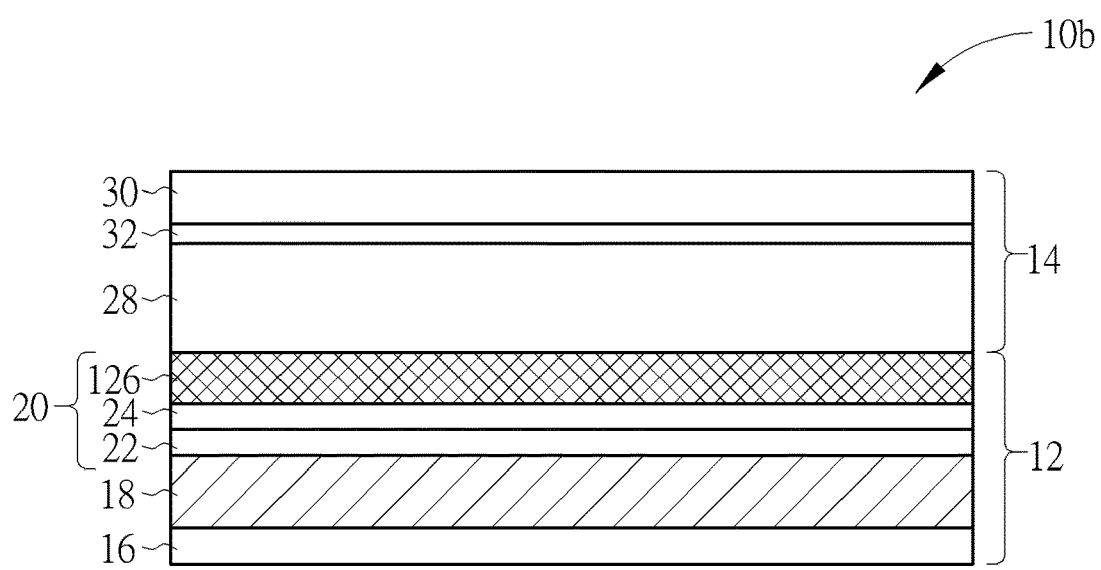
FIG. 2 depicts a semiconductor substrate according to a second preferred embodiment of the present invention.

FIG. 2 depicts a semiconductor substrate according to a second preferred embodiment of the present invention, wherein elements which are substantially the same as those in the first preferred embodiment are denoted by the same reference numerals; an accompanying explanation is therefore omitted.

As shown in FIG. 2, a semiconductor substrate 10b includes an epitaxial layer 12 and a device layer 14. The difference between the first preferred embodiment and the second preferred embodiment is that in the second preferred embodiment the superlattice 26 is replaced by a gradient layer 126. Other elements in the second preferred embodiment have the same position as that of the first preferred embodiment. The gradient layer 126 covers and contacts the transition layer 24. A chemical formula of the gradient layer 126 is $Al_zGa_{1-z}N$, $0 \leq Z \leq 1$, wherein Z decreases from a bottom of the gradient layer 126 to a top of the gradient layer 126. In other words, a value of Z in the gradient layer 126 farther from the transition layer 24 is lower than a value of Z in the gradient layer 126 closer to the transition layer 24. The gradient layer 126 is a multiple-layered structure. The Z value in each layer of the multiple-layered structure is different from each other. For example, the gradient layer 126 may be $AlN/Al_{0.8}Ga_{0.2}N/Al_{0.2}Ga_{0.8}N$ stacked from bottom to top. That is, the layer of AlN contacts the transition layer 24, the layer of $Al_{0.8}Ga_{0.2}N$ contacts the gallium nitride layer 28. However, the gradient layer 126 is not limited to the structure of $AlN/Al_{0.8}Ga_{0.2}N/Al_{0.2}Ga_{0.8}N$. The number of layers in the multiple-layered structure, and the Z value can be altered.

Moreover, besides only one gradient layer 126, there can be numerous gradient layers 126. For example, if the gradient layer 126 has a structure of $AlN/Al_{0.8}Ga_{0.2}N/Al_{0.2}Ga_{0.8}N$, and there are two gradient layers 126, these two gradient layers 126 become a structure of $AlN/Al_{0.8}Ga_{0.2}N/Al_{0.2}Ga_{0.8}N$ stacked on a structure of $AlN/Al_{0.8}Ga_{0.2}N/Al_{0.2}Ga_{0.8}N$.

Figure 3:
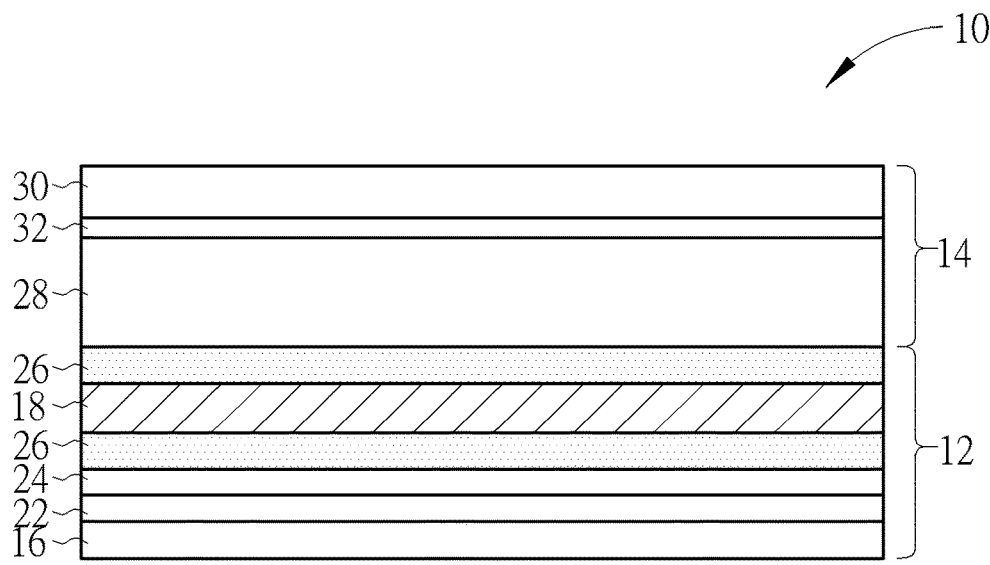
FIG. 3 depicts a semiconductor substrate according to a third preferred embodiment of the present invention.

FIG. 3 depicts a semiconductor substrate according to a third preferred embodiment of the present invention, wherein elements which are substantially the same as those in the first preferred embodiment are denoted by the same reference numerals; an accompanying explanation is therefore omitted.

The difference between the first preferred embodiment and the third preferred embodiment is that in the third preferred embodiment the strain-relaxed layer 18 of the semiconductor substrate 10c is inserted into the superlattice 26 and separates the superlattice 26 into two parts. In details, the epitaxial layer 12 in the third preferred embodiment includes substrate 16, the nucleation layer 22, the transition layer 24 and the superlattice 26. The superlattice 26 covers and contacts the transition layer 24. The transition layer 24 covers and contacts the nucleation layer 22. The nucleation layer 22 covers and contacts the substrate 16. The strain-relaxed layer is inserted between the repeated stacked structure of the superlattice 26. For example, if the superlattice 26 is formed by periodically stacking $AlN/Al_{0.2}Ga_{0.8}N$, the strain-relaxed layer 18 can be disposed between AlN and $Al_{0.2}Ga_{0.8}N$ formed by any repeated cycle.

Figure 4:
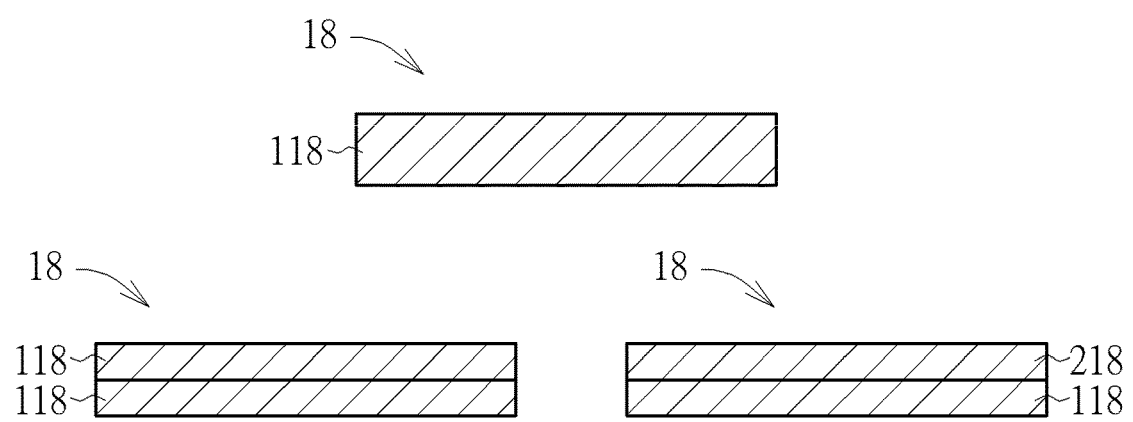
FIG. 4 depicts a schematic diagram of a strain-relaxed layer of the present invention.

FIG. 4 depicts a schematic diagram of a strain-relaxed layer of the present invention. The strain-relaxed layers 18 shown in FIG. 4 can be applied to the first preferred embodiment, the second preferred embodiment and the third preferred embodiment. As shown in FIG. 4, the strain-relaxed layers 18 can has several types. The strain-relaxed layer 18 at the topmost of FIG. 4 includes one first strain-relaxed layer 118. The first strain-relaxed layer 118 is single-layered. The first strain-relaxed layer 118 includes silicon oxide, silicon nitride or silicon carbide. For example, the first strain-relaxed layer 118 can be silicon nitride. Moreover, the first strain-relaxed layer 118 can also be multiple-layered from by different materials. For instance, the first strain-relaxed layer 118 can be silicon carbide/silicon nitride.

Furthermore, as shown in the bottom left of FIG. 4, the strain-relaxed layer 18 includes numerous first strain-relaxed layers 118. For example, if the first strain-relaxed layer 118 is silicon carbide/silicon nitride, two first strain-relaxed layers 118 have a structure of silicon carbide/silicon nitride/silicon carbide/silicon nitride.

As shown in the bottom right of FIG. 4, besides the first strain-relaxed layer 118, the strain-relaxed layer 18 can further include a second strain-relaxed layer 218 disposed on the first strain-relaxed layer 118. The second strain-relaxed layer 218 can be silicon oxide, silicon nitride or silicon carbide. The second strain-relaxed layer 218 can be single-layered or multiple-layered. For example, the second strain-relaxed layer 218 can be a single-layered structure formed of silicon oxide or a multiple-layered formed of silicon nitride/silicon oxide.

Based on different requirement, different types of strain-relaxed layers 18 in FIG. 4 can be applied to the epitaxial substrate 12 in the first preferred embodiment, the second preferred embodiment and the third preferred embodiment.

Because the lattice size of the substrate 16 and the lattice size of the gallium nitride layer 28 are greatly different from each other, when the gallium nitride layer 28 directly contacts the substrate 16, stresses are respectively generated in the substrate 16 and the gallium nitride layer 28 due to lattice mismatch. Theses stresses influence the quality and efficiency of the semiconductor devices formed on the device layer 14. The nucleation layer 22, the transition layer 22 and the superlattice 26 or the gradient layer 126 can compensate some of the lattice mismatch between the substrate 16 and the gallium nitride layer 28. However, it is not good enough to solve the mismatch problem only by the nucleation layer 22, the transition layer 22 and the superlattice 26 or the gradient layer 126.

Therefore, a strain-relaxed layer 18 is disposed between the substrate 16 and the gallium nitride layer 28. Because the lattice structure of the strain-relaxed layer 18 can relaxed stress, even placing the strain-relaxed layer 18 on a material with large lattice mismatch comparing to the strain-relaxed layer 18, only small stress or even no stress will be formed in the strain-relaxed layer 18. Therefore, when placing the strain-relaxed layer 18 between the substrate 16 and the gallium nitride layer 28, the lattice mismatch between the substrate 16 and the strain-relaxed layer 18 will only generate small stress or even no stress in the strain-relaxed layer 18. In this way, the gallium nitride layer 28 on the strain-relaxed layer 18 will not be influenced by the lattice mismatch. Briefly speaking, the strain-relaxed layer 18 can prevent or decrease a material below the strain-relaxed layer 18 from generating stress to a material on the strain-relaxed layer 18. On the other hand, the strain-relaxed layer 18 can prevent or decrease a material on the strain-relaxed layer 18 from generating stress to a material below the strain-relaxed layer 18.

In addition, the strain-relaxed layer 18 specially uses silicon oxide, silicon nitride or silicon carbide not only to compensate the stress due to lattice mismatch, but also to make the III-V compound stacked layer 20a attached on the strain-relaxed layer 18 better, because the nucleation layer 22 or the superlattice 26 has a good attachment ability to the strain-relaxed layer 18. Moreover, the band gap of the silicon oxide, silicon nitride or silicon carbide is larger than that of gallium nitride, therefore, the strain-relaxed layer 18 can increase a breakdown voltage of a semiconductor device formed afterwards.

Figure 5:
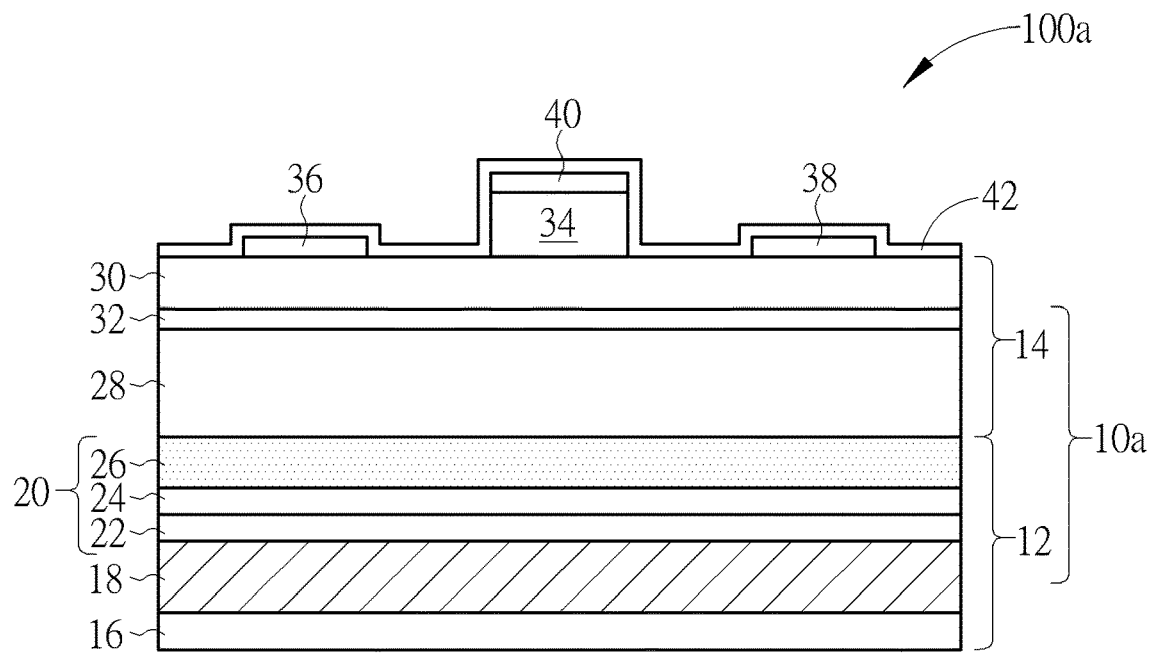
FIG. 5 depicts an HEMT formed by using a semiconductor substrate in the first preferred embodiment of the present invention.

FIG. 5 depicts an HEMT formed by using a semiconductor substrate in the first preferred embodiment of the present invention, wherein elements which are substantially the same as those in the first preferred embodiment are denoted by the same reference numerals; an accompanying explanation is therefore omitted.

As shown in FIG. 5, an HEMT 100a includes a semiconductor substrate 10a, a P-type gallium nitride layer 34 is disposed on an aluminum gallium nitride layer 30. A source electrode 36 and a drain electrode 38 are disposed on the aluminum gallium nitride layer 30. The source electrode 36 and the drain electrode 38 are respectively disposed at two sides of the P-type gallium nitride layer 34. A gate electrode 40 is disposed between the source electrode 36 and the drain electrode 38 and on the aluminum gallium nitride layer 30. The gate electrode 40 covers the P-type gallium nitride layer 34. A protective layer 42 conformally covers the gate electrode 40, the source electrode 36, the drain electrode 38 and the aluminum gallium nitride layer 30. The protective layer 42 includes gallium nitride or aluminum nitride. The HEMT 100a is a normally-off transistor.

Figure 6:
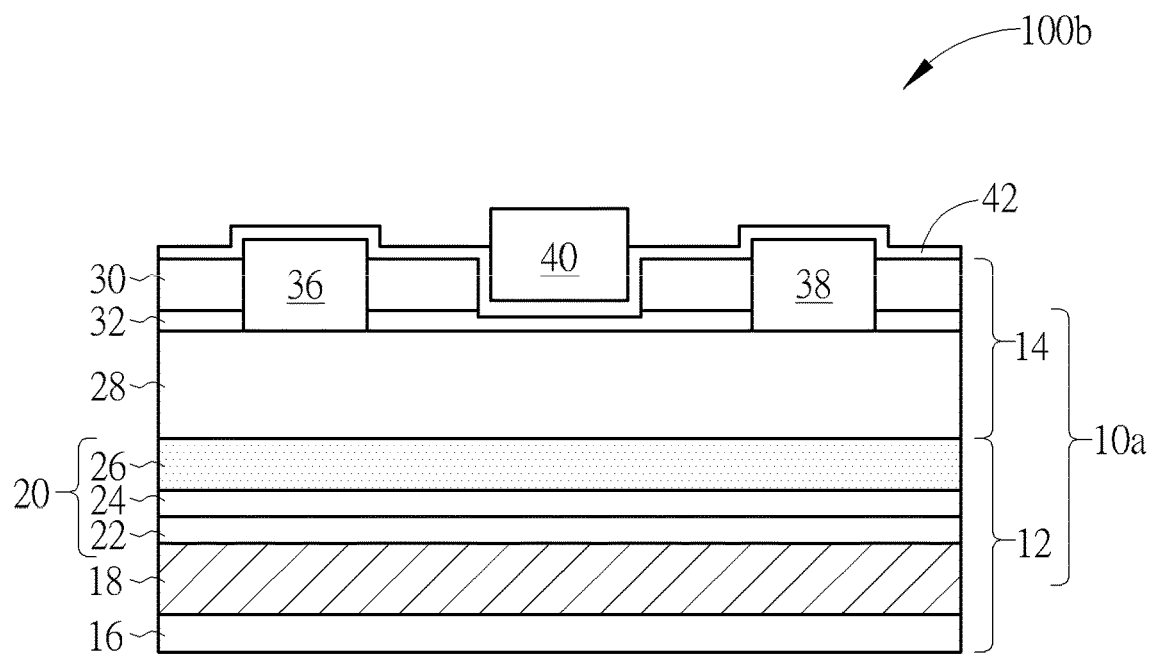
FIG. 6 depicts another HEMT formed by using a semiconductor substrate in the first preferred embodiment of the present invention.

FIG. 6 depicts another HEMT formed by using a semiconductor substrate in the first preferred embodiment of the present invention, wherein elements which are substantially the same as those in the first preferred embodiment are denoted by the same reference numerals; an accompanying explanation is therefore omitted.

As shown in FIG. 6, an HEMT 100b includes a semiconductor substrate 10b. A source electrode 36 and a drain electrode 38 are embedded in the aluminum gallium nitride layer 30. A gate electrode 40 is disposed between the source electrode 36 and the drain electrode 38 and embedded in the aluminum gallium nitride layer 30. A protective layer 42 conformally covers the source electrode 36, the drain electrode 38 and the aluminum gallium nitride layer 30. The protective layer 42 is between the gate electrode 40 and the aluminum gallium nitride layer 30. The HEMT 100b is a normally-off transistor.

Figure 7:
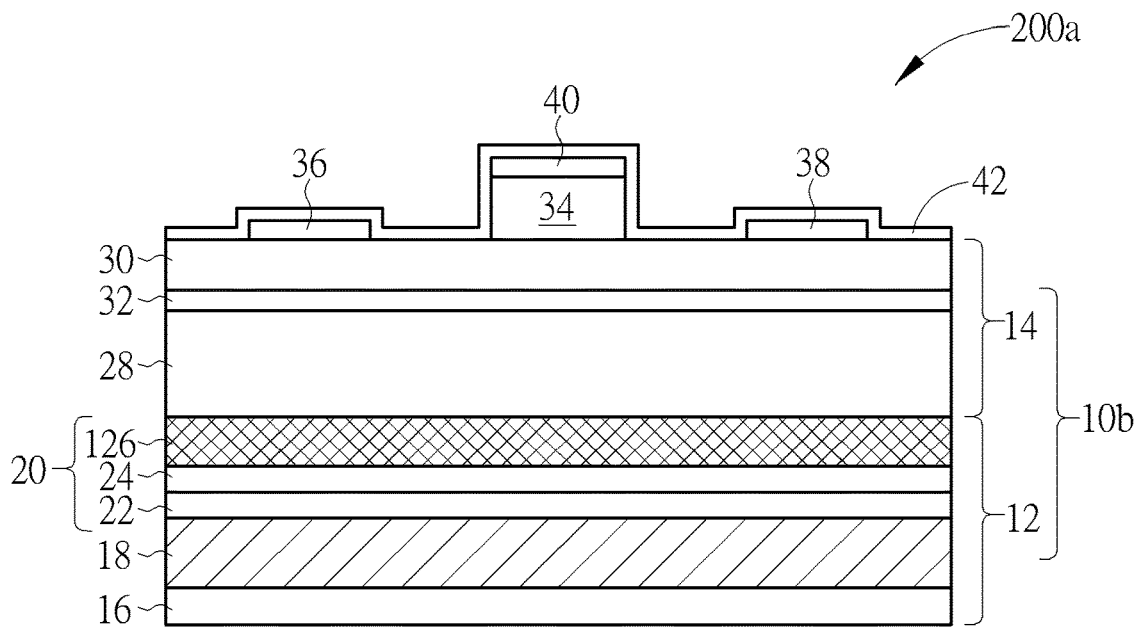
FIG. 7 depicts an HEMT formed by using a semiconductor substrate in the second preferred embodiment of the present invention.

FIG. 7 depicts an HEMT formed by using a semiconductor substrate in the second preferred embodiment of the present invention, wherein elements which are substantially the same as those in the second preferred embodiment are denoted by the same reference numerals; an accompanying explanation is therefore omitted.

The difference between the HEMT 200a in FIG. 7 and the HEMT 100a in FIG. 5 is that the superlattice 26 in FIG. 5 is replaced by a gradient layer 126 in the semiconductor substrate 10b in FIG. 7. Other elements, such as the P-type gallium nitride layer 34, the protective layer 42, the source electrode 36, the drain electrode 38 or the gate electrode 40, have the same position as those in the HEMT 100a in FIG. 5. Similarly, the HEMT 200a is a normally-off transistor.

Figure 8:
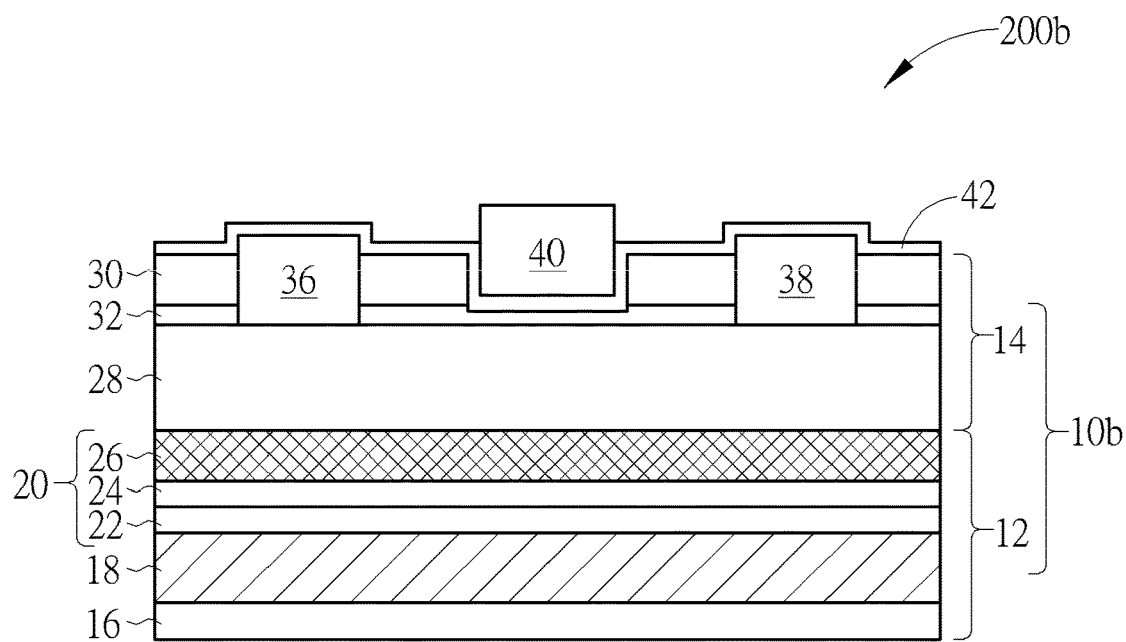
FIG. 8 depicts another HEMT formed by using a semiconductor substrate in the second preferred embodiment of the present invention.

FIG. 8 depicts another HEMT formed by using a semiconductor substrate in the second preferred embodiment of the present invention, wherein elements which are substantially the same as those in the second preferred embodiment are denoted by the same reference numerals; an accompanying explanation is therefore omitted.

The difference between the HEMT 200b in FIG. 8 and the HEMT 100b in FIG. 6 is that the superlattice 26 in FIG. 6 is replaced by a gradient layer 126 in the semiconductor substrate 10b in FIG. 8. Other elements, such as the protective layer 42, the source electrode 36, the drain electrode 38 or the gate electrode 40, have the same position as those in the HEMT 100b in FIG. 6. Similarly, the HEMT 200b is a normally-off transistor.

Figure 9:
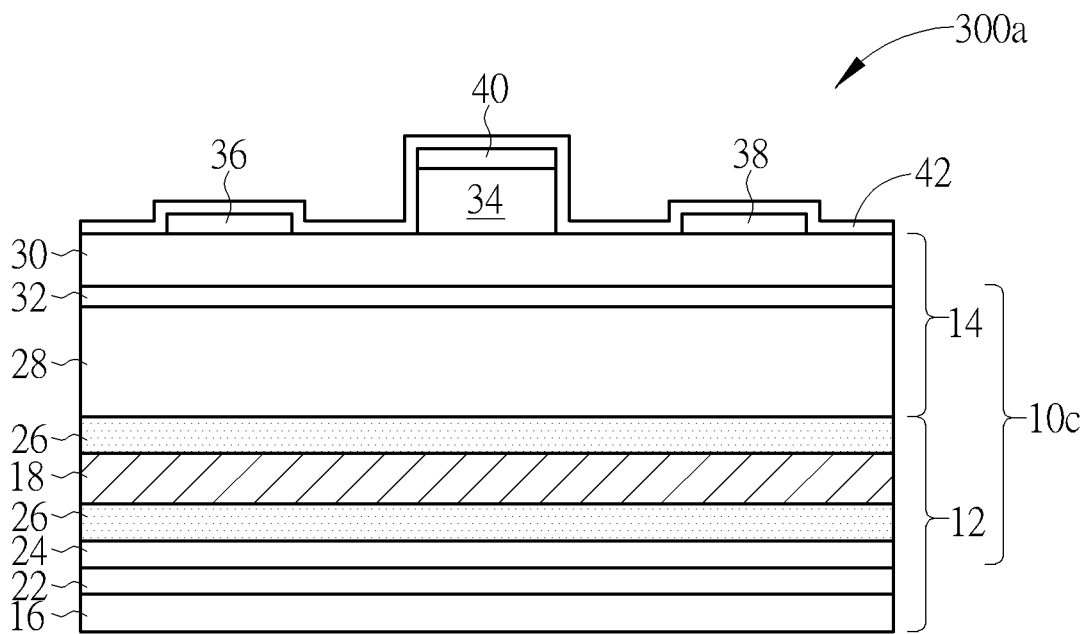
FIG. 9 depicts an HEMT formed by using a semiconductor substrate in the third preferred embodiment of the present invention.

FIG. 9 depicts an HEMT formed by using a semiconductor substrate in the third preferred embodiment of the present invention, wherein elements which are substantially the same as those in the third preferred embodiment are denoted by the same reference numerals; an accompanying explanation is therefore omitted.

The difference between the HEMT 300a in FIG. 9 and the HEMT 100a in FIG. 5 is that the strain-relaxed layer 18 is inserted into the superlattices 26 in FIG. 9. Other elements, such as the P-type gallium nitride layer 34, the protective layer 42, the source electrode 36, the drain electrode 38 or the gate electrode 40, have the same position as those in the HEMT 100a in FIG. 5. Similarly, the HEMT 300a is a normally-off transistor.

Figure 10:
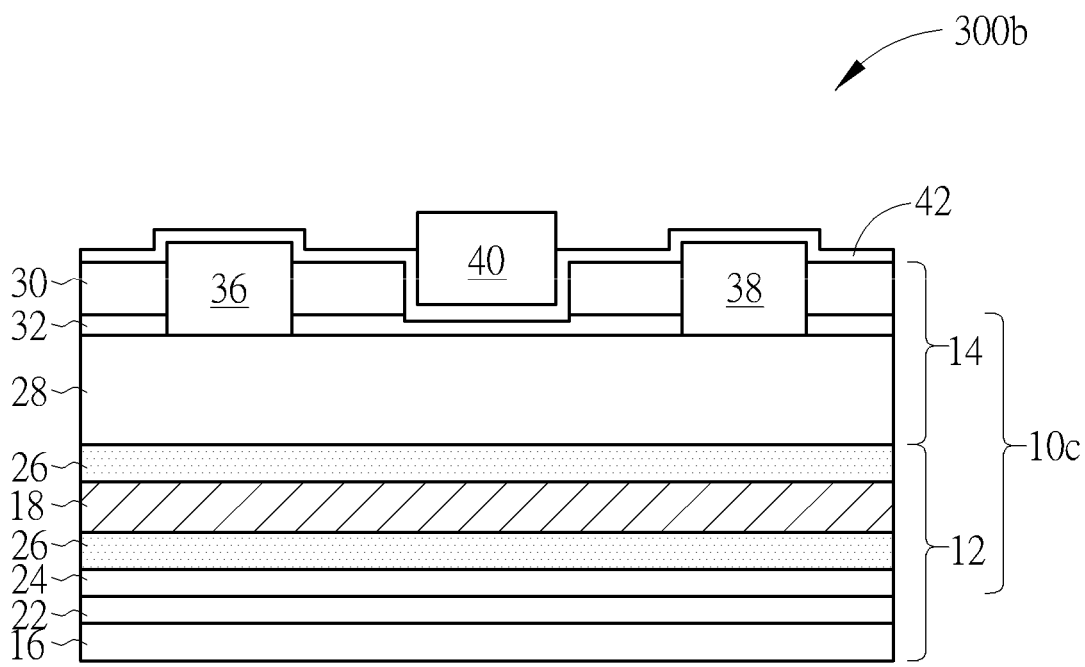
FIG. 10 depicts another HEMT formed by using a semiconductor substrate in the third preferred embodiment of the present invention.

FIG. 10 depicts another HEMT formed by using a semiconductor substrate in the third preferred embodiment of the present invention, wherein elements which are substantially the same as those in the third preferred embodiment are denoted by the same reference numerals; an accompanying explanation is therefore omitted.

The difference between the HEMT 300b in FIG. 100 and the HEMT 100b in FIG. 6 is that that the strain-relaxed layer 18 is inserted into the superlattices 26 in FIG. 9. Other elements, such as the protective layer 42, the source electrode 36, the drain electrode 38 or the gate electrode 40, have the same position as those in the HEMT 100b in FIG. 6. Similarly, the HEMT 300b is a normally-off transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
an epitaxial substrate comprising:
a substrate;
a strain-relaxed layer covering and contacting the substrate, wherein the strain-relaxed layer comprises a first strain-relaxed layer, the first strain-relaxed layer comprises silicon oxide or silicon carbide, the first strain-relaxed layer comprises a plurality of different material layers, one of the plurality of different material layers is silicon oxide and another one of the plurality of different material layers is silicon carbide, and wherein there is no stress in the strain-relaxed layer; and
a III-V compound stacked layer covering and contacting the strain-relaxed layer, wherein the III-V compound stacked layer comprises a nucleation layer covering and contacting the strain-relaxed layer, a transition layer covering and contacting the nucleation layer, a superlattice covering and contacting the transition layer, and wherein the superlattice is formed by alternately stacking aluminum gallium nitride and aluminum nitride, and there is no carbon within aluminum gallium nitride.

2. The semiconductor device of claim 1, wherein the nucleation layer comprises aluminum nitride, and the transition layer comprises aluminum gallium nitride.

3. The semiconductor device of claim 1, wherein a chemical formula of the aluminum gallium nitride in the superlattice is $Al_yGa_{1-y}N$, and $0.2 \leq Y \leq 0.3$.

4. The semiconductor device of claim 2, wherein a chemical formula of the aluminum gallium nitride in the transition layer is $Al_xGa_{1-x}N$, and $0.7 \leq X \leq 0.8$.

5. The semiconductor device of claim 1, wherein the substrate comprises a silicon substrate, a sapphire substrate or a silicon on insulator substrate.

6. The semiconductor device of claim 1, further comprising:
a device layer contacting and covering the epitaxial substrate, wherein the device layer comprising:
a gallium nitride layer; and
an aluminum gallium nitride layer disposed on the gallium nitride layer.

7. The semiconductor device of claim 6, further comprising:
an HEMT disposed on the epitaxial substrate, wherein the HEMT comprises:
the epitaxial substrate;
the device layer;
a source electrode and a drain electrode disposed on the aluminum gallium nitride layer; and
a gate electrode disposed between the source electrode and the drain electrode and on the aluminum gallium nitride layer.

8. The semiconductor device of claim 1, further comprising a plurality of the first strain-relaxed layers stacking and contacting each other.

9. The semiconductor device of claim 1, wherein the strain-relaxed layer further comprises a second strain-relaxed layer contacting the first strain-relaxed layer, the second strain-relaxed layer comprises silicon oxide, silicon nitride or silicon carbide.

10. The semiconductor device of claim 1, wherein a thickness of the strain-relaxed layer is greater than 1 nanometer.

* * * * *